(12) United States Patent
Iguchi

(10) Patent No.: US 11,187,917 B2
(45) Date of Patent: Nov. 30, 2021

(54) THREE-DIMENSIONAL DISPLAY AND AERIAL THREE-DIMENSIONAL DISPLAY

(71) Applicant: SHARP KABUSHIKI KAISHA, Osaka (JP)

(72) Inventor: Katsuji Iguchi, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/260,977

(22) Filed: Jan. 29, 2019

(65) Prior Publication Data

US 2019/0243149 A1 Aug. 8, 2019

(30) Foreign Application Priority Data

Feb. 5, 2018 (JP) .............................. JP2018-018224

(51) Int. Cl.
| | |
|---|---|
| *H01L 25/075* | (2006.01) |
| *H01L 25/16* | (2006.01) |
| *G02B 30/00* | (2020.01) |
| *G02B 3/00* | (2006.01) |
| *H01L 33/60* | (2010.01) |
| *H01L 33/32* | (2010.01) |
| *H01L 33/30* | (2010.01) |
| *H01L 33/58* | (2010.01) |
| *G02B 30/26* | (2020.01) |
| *G02B 30/27* | (2020.01) |

(52) U.S. Cl.
CPC ........... *G02B 30/00* (2020.01); *G02B 3/0006* (2013.01); *G02B 3/0056* (2013.01); *G02B 30/26* (2020.01); *G02B 30/27* (2020.01); *H01L 25/0753* (2013.01); *H01L 25/167* (2013.01); *H01L 33/30* (2013.01); *H01L 33/32* (2013.01); *H01L 33/58* (2013.01); *H01L 33/60* (2013.01)

(58) Field of Classification Search
CPC ........ G02B 30/00; G02B 30/26; G02B 30/27; G02B 3/0056; G02B 3/0006; G02B 27/2292; H01L 25/0753; H01L 33/60; H01L 33/32; H01L 33/30; H01L 33/58; H01L 25/167; H01L 33/48–648; H01L 2933/0033; H01L 2933/005; H01L 2933/0066–0091; H01L 33/50–508; H01L 2933/0041; G09F 9/33
See application file for complete search history.

(56) References Cited

U.S. PATENT DOCUMENTS

| | | | | |
|---|---|---|---|---|
| 2005/0122031 A1* | 6/2005 | Itai | .......................... | H01L 33/62 313/498 |
| 2013/0285885 A1* | 10/2013 | Nowatzyk | .......... | G02B 27/0172 345/8 |
| 2015/0260368 A1* | 9/2015 | Enomoto | ............ | G02B 19/0014 362/235 |
| 2017/0069612 A1* | 3/2017 | Zhang | ...................... | H01L 33/52 |
| 2017/0092823 A1* | 3/2017 | Ukawa | .................. | H01L 33/486 |
| 2017/0250219 A1* | 8/2017 | Bower | .................... | H01L 33/46 |

* cited by examiner

*Primary Examiner* — Cuong B Nguyen
(74) *Attorney, Agent, or Firm* — ScienBiziP, P.C.

(57) ABSTRACT

A display portion including a plurality of pixel units that are paired with a plurality of micro lenses is provided, in which each of the pixel units has a plurality of pixels and each of the pixels includes a micro LED.

24 Claims, 11 Drawing Sheets

THREE-DIMENSIONAL DISPLAY AND AERIAL THREE-DIMENSIONAL DISPLAY

BACKGROUND

1. Field

The present disclosure relates to a three-dimensional display and an aerial three-dimensional display which display a three-dimensional image.

2. Description of the Related Art

As a three-dimensional display technology by which a three-dimensional image is able to be viewed from various angles, an integral imaging technology (integral imaging or integral photography technology) has been known, for example. The integral imaging technology is a technology in which a flat panel display and a lens array are combined, and light emitted from each pixel of the flat panel display is deflected by a lens to thereby generate horizontal parallax and vertical parallax (for example, refer to Yasuhiro Takagi, "Three-dimensional display technology: from naked-eye to holography", Display technology yearbook 2012, Nikkei Business Publications, Inc.).

Further, a technology by which a three-dimensional image is displayed in the air using a specific reflection optical device has been proposed, and examples thereof include a technology using a reflection optical device referred to as a dihedral corner reflector array (DCRA) (for example, refer to WO2010/131622 (published on Nov. 18, 2010)). According to such a technology, by arranging the DCRA above an object, an image of the object is able to be displayed as floating in the air above the DCRA.

Furthermore, a three-dimensional display that three-dimensionally displays an object in the air by combining the integral imaging technology and the technology using the reflection optical device which are described above is also commercialized (for example, refer to Ashley Carman, "The HoloPlayer One lets you interact with 3D holograms", Nov. 21, 2017, The verge, [searched on Jan. 24, 2018], Internet <URL: https://www.theverge.com/circuitbreaker/2017/11/21/16681580/holoplayer-one-looking-glass-holograms>).

However, the above-described three-dimensional display using the integral imaging technology or the reflection optical device has a problem that light is refracted, dispersed, or reflected by an optical member, so that an amount of light reaching an eye of a user is less than that of an image displayed on a typical flat panel display, and therefore, a displayed image becomes dark.

In a configuration of using liquid crystal display (LCD) as in the integral imaging technology of the related art, emission intensity of backlight of the LCD should be increased in order to reduce the darkness. However, increase in the emission intensity of the backlight leads to excessive increase in power consumption and increase in cost of the backlight.

An aspect of the disclosure is made in view of circumstances described above to achieve a three-dimensional display configured to display a three-dimensional image efficiently and brightly.

SUMMARY

A three-dimensional display according to an aspect of the disclosure is configured to include a display portion that includes a micro lens array in which a plurality of micro lenses are arranged in a two-dimensional array and a display device in which a plurality of pixel units that are paired with the respective micro lenses are arranged in a two-dimensional array. Each of the pixel units has a plurality of pixels and each of the pixels includes a micro LED.

An aerial three-dimensional display according to an aspect of the disclosure is configured to include the three-dimensional display and a reflection optical device by which a three-dimensional image generated by the three-dimensional display is displayed in the air.

DESCRIPTION OF THE EMBODIMENTS

Embodiment 1

Hereinafter, Embodiment 1 of the disclosure will be described in detail.

(Entire Configuration of Three-Dimensional Display 100)

Figure 1:
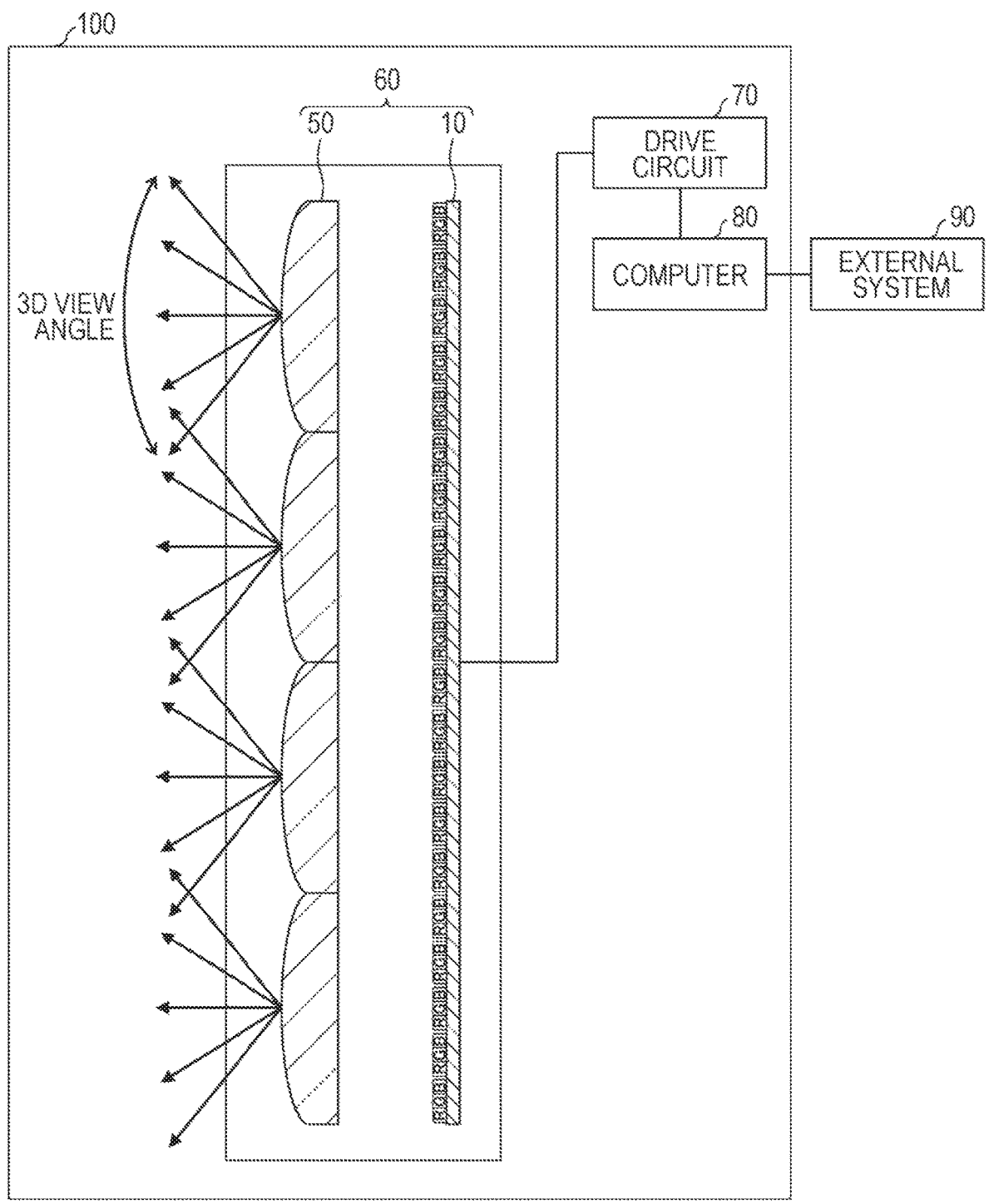
FIG. 1 is a view schematically illustrating an entire configuration of a three-dimensional display according to Embodiment 1 of the disclosure.

FIG. 1 is a view schematically illustrating an entire configuration of a three-dimensional display 100 according to Embodiment 1 of the disclosure. As illustrated in FIG. 1, the three-dimensional display 100 includes a display portion 60, a drive circuit 70, and a computer 80.

The computer 80 acquires image data from an external system, such as an external image server, which is connected to the computer 80 in a wired or wireless manner. Moreover, for example, the computer 80 may be configured to be able to generate image data by a computer graphic technology. The image data generated by the computer 80 or acquired by the computer 80 from the external system 90 is image data in which an object is seen from multiple directions different from each other. Though details will be described below, the three-dimensional display 100 is an apparatus capable of displaying the image data in a three-dimensional (3D) manner. Hereinafter, a range where an object is able to be three-dimensionally viewed by using the three-dimensional display 100 is represented as a 3D view angle.

The drive circuit 70 transmits an amount of light emission to each pixel of the display portion 60 on the basis of the image data generated or acquired by the computer 80, and thereby causes the display portion 60 to emit light and display a three-dimensional image.

Note that, since the computer 80 and the drive circuit 70 are able to be configured by using known various kinds of technologies, the display portion 60 will be mainly described in the present embodiment.
(Configuration of Display Portion 60)

Figure 2:
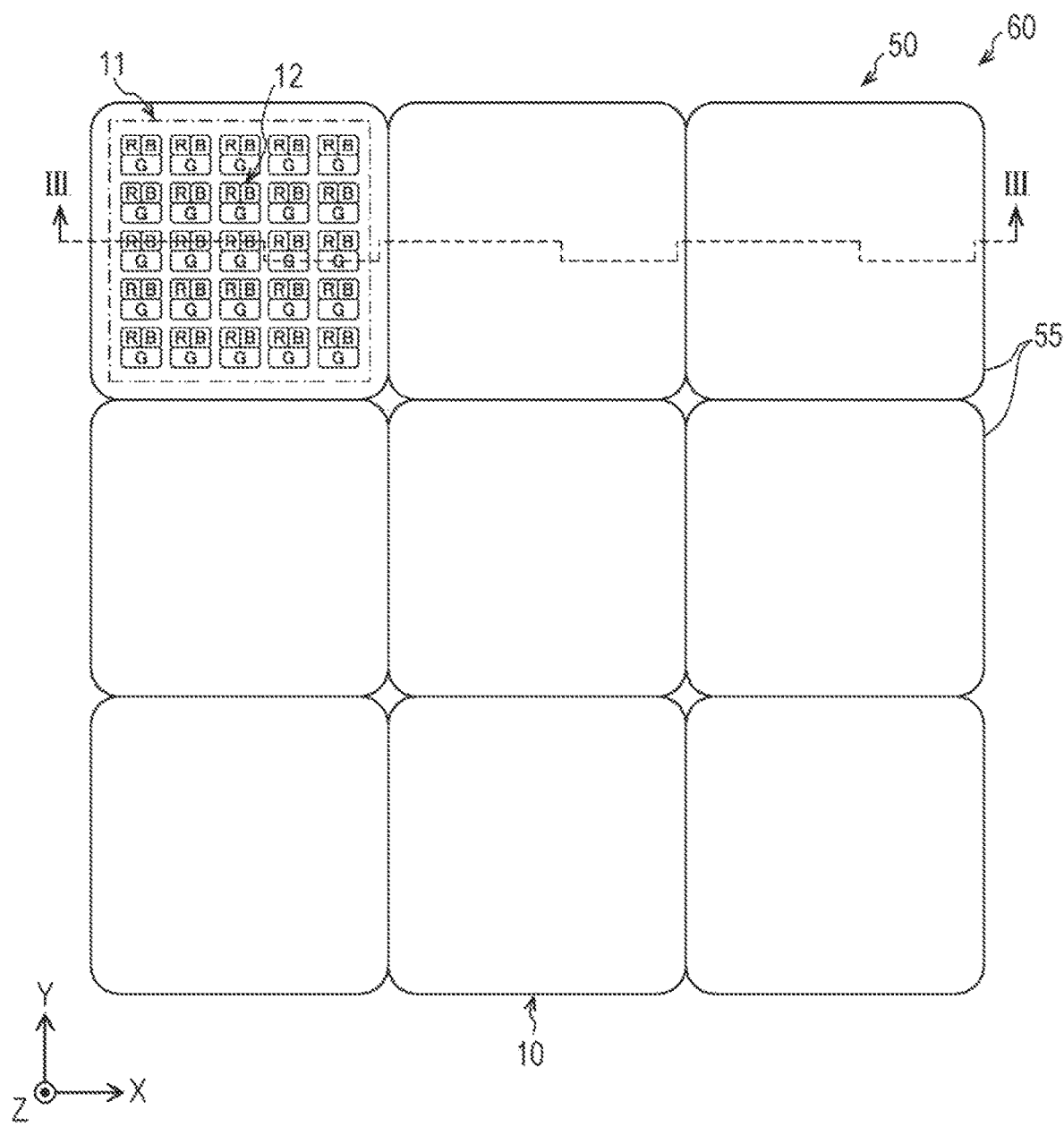
FIG. 2 is a top view of a display portion.
Figure 3:
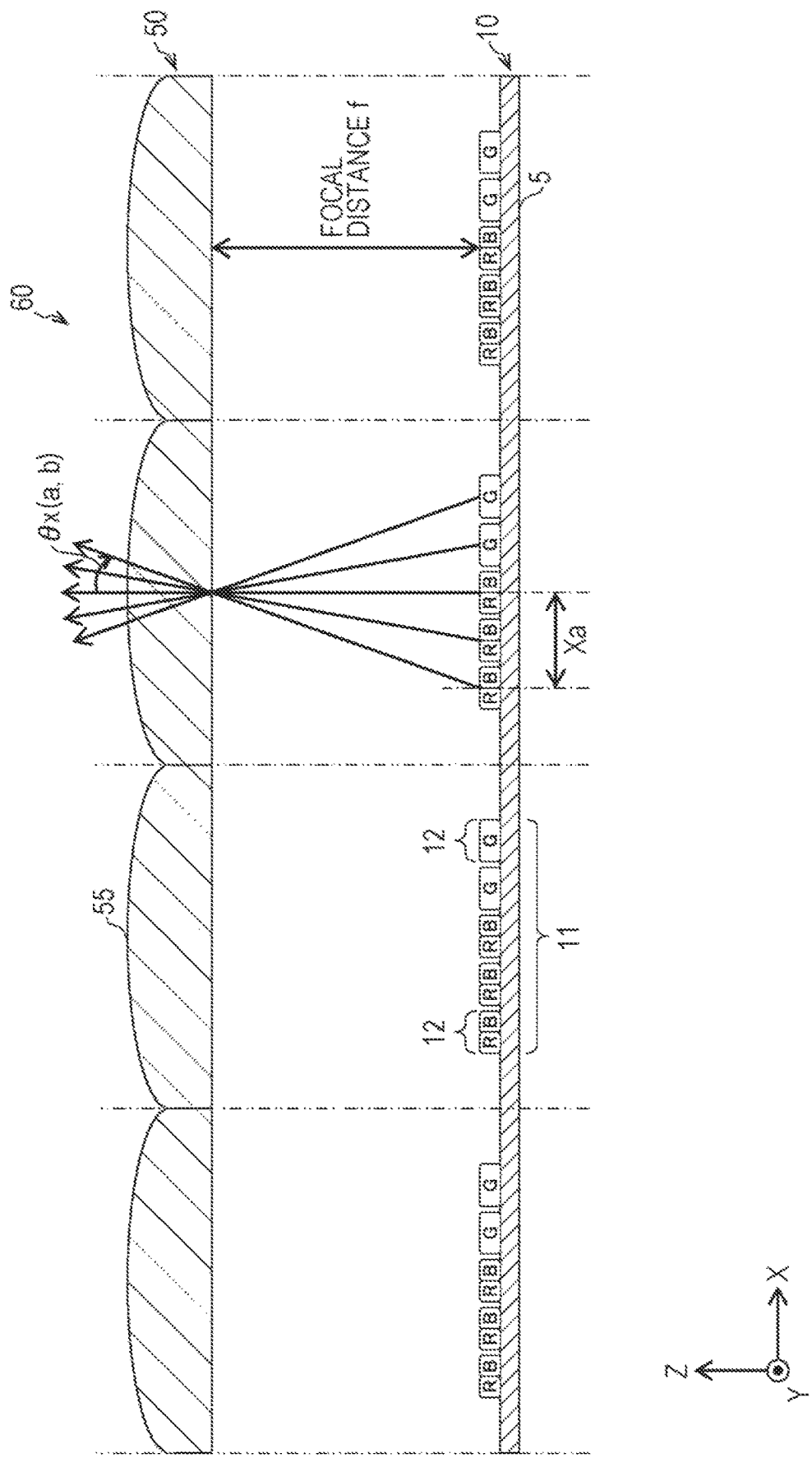
FIG. 3 is a sectional view of the display portion taken along a line III-III of FIG. 2.

FIG. 2 is a top view of the display portion 60. FIG. 3 is a sectional view of the display portion 60 taken along a line III-III of FIG. 2. As illustrated in FIGS. 2 and 3, the display portion 60 includes a micro lens array 50 and a display device 10.

The micro lens array 50 includes a plurality of micro lenses 55 which are arranged in a two-dimensional array. The micro lens array 50 includes, for example, 430×270 micro lenses 55. Note that, the number of micro lenses 55 included in the micro lens array 50 is able to be appropriately selected from several tens of thousands to several thousands of thousands, and the number in the present embodiment is not limited to the above-described number.

The display device 10 includes a substrate 5 and a plurality of pixel units 11, and is configured such that the plurality of pixel units 11 are arranged on a surface of the substrate 5 in a two-dimensional array. Each of the plurality of pixel units 11 of the display device 10 is paired with corresponding one of the micro lenses 55 of the micro lens array 50.

The pixel unit 11 includes a plurality of pixels 12, and the pixels 12 face a micro lens 55. FIGS. 1 and 2 illustrate an example in which each of the pixel units 11 includes a total of 25 pixels 12 arranged in 5 rows×5 columns, but the number of pixels 12 included in the pixel unit 11 may be two or more, and an arrangement pattern of the pixels 12 in the pixel unit 11 is not limited to a matrix form and may be various patterns. The plurality of pixel units 11 are arranged in a simple two-dimensional matrix pattern but the two-dimensional array is not limited to this one. It is preferable that there are spaces between neighboring pixel units, where no pixels are placed as illustrated in FIG. 3, because stray light entering of the micro lenses from not-paired pixel units can be reduced.

As illustrated in FIG. 3, a distance between the micro lens array 50 and the display device 10 is set to be equal to a focal distance f of the micro lens 55. This means that light emitting points of each pixel unit 11 are placed on a focal plane of corresponding one of the micro lenses 55. Accordingly, light emitted by the pixels 12 is converged by the micro lens 55, transmitted by the micro lens 55, and then radiated in certain directions as light parallel to each other, without diverging. A traveling direction thereof is able to be calculated as follows. When coordinates of a pixel 12 are (Xa, Xb) with an intersection of an optical axis of the micro lens 55 and the display unit 11 as an origin, light emitted from the pixel 12 travels in an X direction (horizontal direction, for example) by θx and in a Y direction (vertical direction, for example) by θy from the optical axis of the micro lens 55. Here, tan θx equals −Xa/f, and tan θy equals −Yb/f. Accordingly, the 3D view angle is decided by the focal distance f and a distance from the center of the pixel unit 11 to an outmost peripheral pixel.

In this manner, in the display portion 60 of the three-dimensional display 100, the respective pixels 12 emit light in directions of (θx, θy), that is, in directions different from each other. Accordingly, when a direction in which a user views the display portion 60 changes, pixels 12 that are viewed by the user change. Thus, when the pixels 12 correctly display optical signals of an object as viewed from corresponding directions, an observer is able to recognize a natural three-dimensional image by changing a view point.
(Configuration of Pixel 12)

Figure 4:
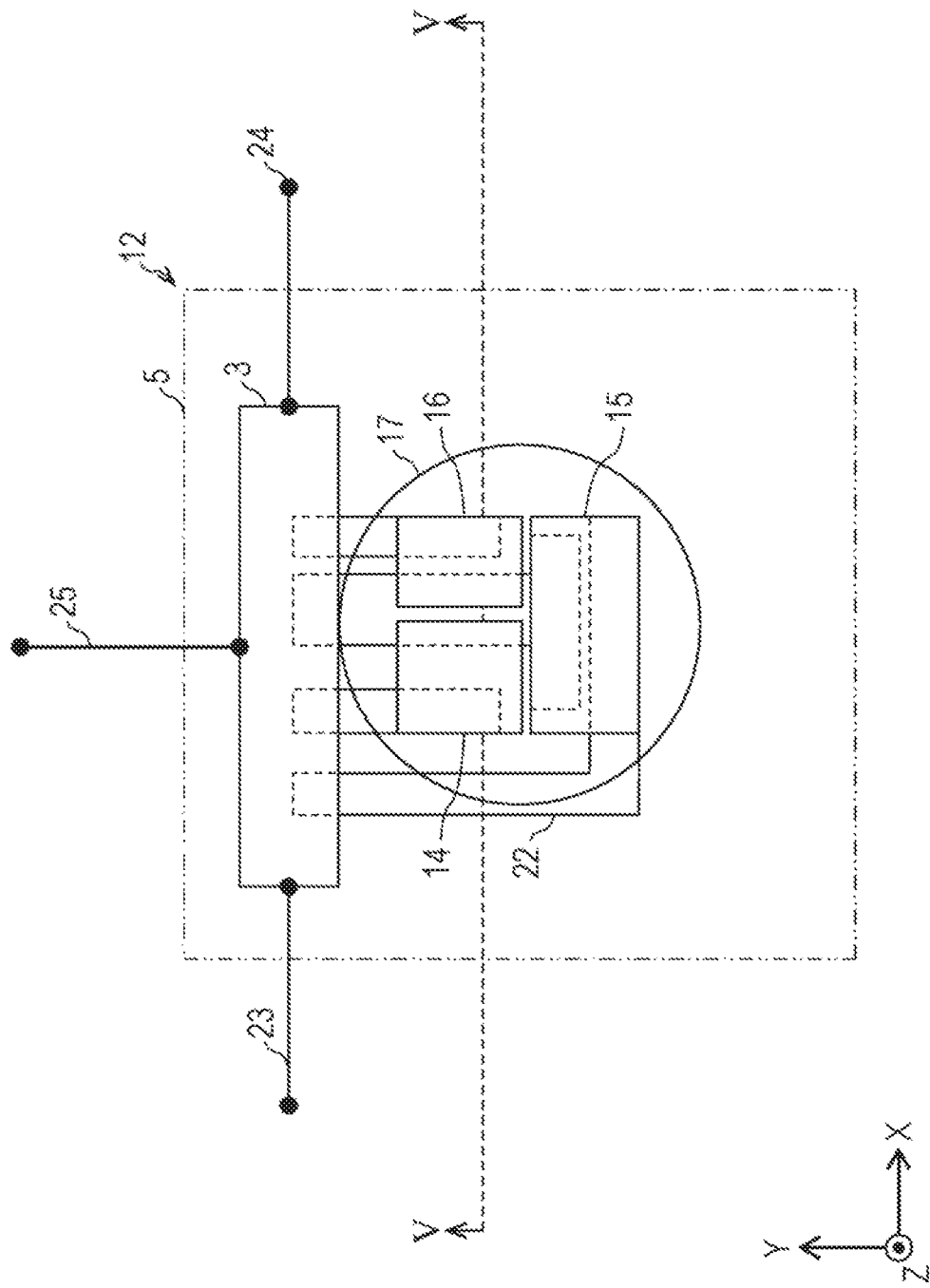
FIG. 4 is a top view of a pixel.
Figure 5:
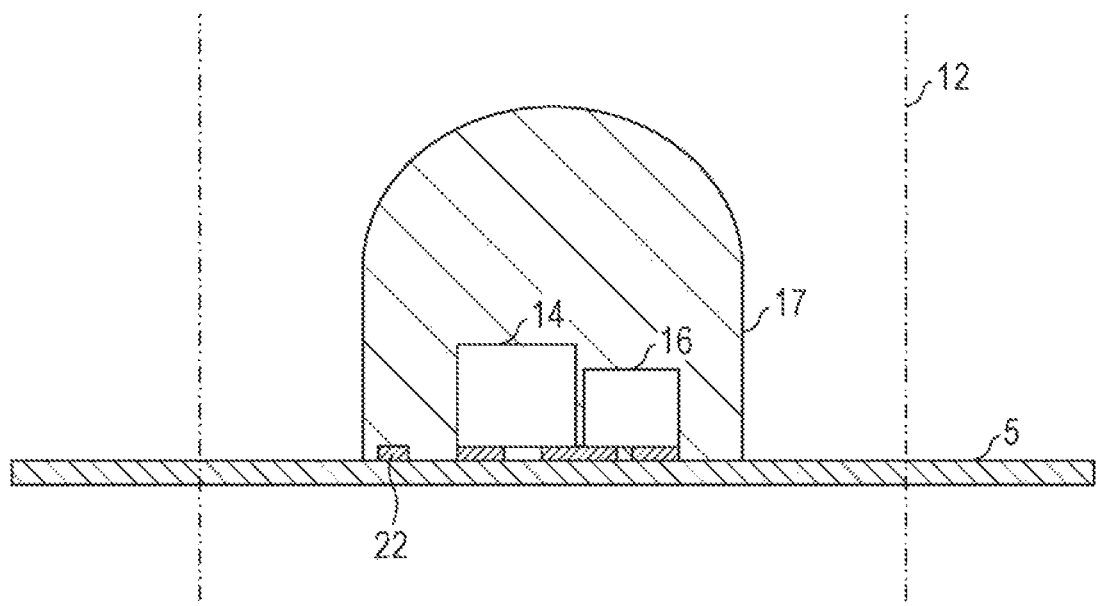
FIG. 5 is a sectional view of the pixel taken along a line V-V of FIG. 4.

FIG. 4 is a top view of the pixel 12. FIG. 5 is a sectional view of the pixel 12 taken along a line V-V of FIG. 4. As illustrated in FIGS. 4 and 5, each of the pixels 12 includes micro LEDs 14, 15, and 16. Moreover, each of the pixels 12 may include at least three micro LEDs 14, 15, and 16 of a red light emitting micro LED 14 that emits light of a red wavelength band, a green light emitting micro LED 15 that emits light of a green wavelength band, and a blue light emitting micro LED 16 that emits light of a blue wavelength band. In this manner, in the three-dimensional display 100 using the integral imaging technology of the present embodiment, the display device 10 having three micro LEDs 14, 15, and 16 included in each pixel is used for the display portion 60.

Each pixel 12 is mounted on the substrate 5 such that the red light emitting micro LED 14, the green light emitting micro LED 15, the blue light emitting micro LED 16, and a micro LED drive circuit 3 that supplies currents for lighting the micro LEDs are connected with a pixel wire 22. Moreover, each pixel 12 has a pixel lens 17 that covers the red light emitting micro LED 14, the green light emitting micro LED 15, and the blue light emitting micro LED 16.

The substrate 5 is desirably configured such that the red light emitting micro LED 14, the green light emitting micro LED 15, and the blue light emitting micro LED 16 are mounted on the surface of the substrate 5 and then a light-absorbing resin layer is applied on the entire surface of the substrate 5 excluding surfaces of the micro LEDs 14, 15, and 16. Examples of the light-absorbing resin layer include a resin material that is mixed with black pigment, carbon black, or the like. It is also possible to replace the light-absorbing resin layer by other light absorbing material.

Thereby, stray light such as light reflected by a bottom surface of the micro lens 55 or light leaked from the pixel lens 17 is able to be absorbed by the surface of the substrate 5. As a result, contrast of a displayed image is able to be improved. Note that, the application of the light-absorbing resin layer may be performed after the pixel lens 17 is formed.

The red light emitting micro LED 14 is desirably an AlInGaP-based compound semiconductor. The green light emitting micro LED 15 is desirably an InGaN-based compound semiconductor. The blue light emitting micro LED 16 is desirably an InGaN-based compound semiconductor. In this manner, by using the AlInGaP-based compound semiconductor and the InGaN-based compound semiconductor for the micro LEDs 14, 15, and 16, it is possible to suppress power consumption of the micro LEDs 14, 15, and 16. Furthermore, the red light emitting micro LED 14 that is the AlInGaP-based compound semiconductor is able to emit light having a peak wavelength of about 630 nm and thus has high red color purity and enables a color gamut of a color image to expand. The green light emitting micro LED 15 that is the InGaN-based compound semiconductor is able to emit light having a peak wavelength near 525 nm and thus has high green color purity and enables a color gamut of the color image to expand. Similarly, the blue light emitting micro LED 16 that is the InGaN-based compound semiconductor is able to emit light having a peak wavelength near 460 nm and thus has high blue color purity and enables a color gamut of the color image to expand.

The micro LED drive circuit 3 is connected to the drive circuit 70 described above by a column signal line 25, a row selection line 23, and a power supply line 24. Note that, the column signal line 25, the row selection line 23, and the power supply line 24 may be wires having the same configuration as that of the pixel wire 22, or may use a different wire layer. The red light emitting micro LED 14, the green light emitting micro LED 15, and the blue light emitting micro LED 16 emit light with luminance according to an amount of the currents supplied from the micro LED drive circuit 3.

Sizes of the red light emitting micro LED 14, the green light emitting micro LED 15, and the blue light emitting micro LED 16 are smaller than a size of the pixel 12. Thus, the red light emitting micro LED 14, the green light emitting micro LED 15, and the blue light emitting micro LED 16 have a high degree of freedom in terms of being arranged in the pixel 12. However, as illustrated in FIG. 3, the red light emitting micro LED 14, the green light emitting micro LED 15, and the blue light emitting micro LED 16 are desirably arranged to be close to each other in a center part of the pixel 12.

Arrangement positions of the micro LEDs 14, 15, and 16 in the pixel 12 affect a direction of light output from the micro lens 55. For example, in a case where the red light emitting micro LED 14, the green light emitting micro LED 15, and the blue light emitting micro LED 16 are arranged at positions separated from each other, intensity ratio of R (light of a red wavelength band), G (light of a green wavelength band), and B (light of a blue wavelength band) is changed, depending on an angle at which the user views the display portion 60, from a set value in some cases. This means that color is changed depending on the user's view angle. Thus, the red light emitting micro LED 14, the green light emitting micro LED 15, and the blue light emitting micro LED 16 are desirably arranged at positions as close to each other as possible.

In this manner, each pixel 12 includes the red light emitting micro LED 14, the green light emitting micro LED 15, and the blue light emitting micro LED 16. The micro LEDs 14, 15, and 16 have high light emission efficiency and are constituted by crystal of an inorganic material, and thus are able to be stably used for a long time even when being driven with a high current. Accordingly, it is possible to efficiently output light with high luminance from each of the micro LEDs 14, 15, and 16 and the pixels 12 output light in directions different from each other, so that a three-dimensional image is able to be brightly displayed even when only part of the light from the pixels 12 reaches an eye of the user.

Note that, in the present embodiment, a self-light emitting LED is used for each of the red light emitting micro LED 14, the green light emitting micro LED 15, and the blue light emitting micro LED 16. However, LEDs are not limited thereto and micro LEDs in which an LED emitting near ultraviolet or ultraviolet light and a wavelength conversion material such as a phosphor, a quantum dot, or a quantum well film are combined to emit light of respective colors of red, green, and blue may be used. Further, LEDs emitting red light and green light may be realized by combining an LED emitting blue light with such a wavelength conversion material. Moreover, the sizes of the micro LEDs 14, 15, and 16 are able to be changed in consideration of the light emission efficiency thereof, and may be different from each other.

Furthermore, in the present embodiment, the micro LEDs are used for red, green, and blue light-emitting devices, but laser light-emitting devices such as a vertical cavity surface emitting Laser (VCSEL) may be used.

In FIG. 4, the micro LED drive circuit 3 is arranged in each of the pixels 12, but one micro LED drive circuit 3 may be shared by a plurality of pixels 12. Moreover, without mounting the micro LED drive circuit 3 on the substrate 5 similarly to the micro LEDs 14, 15, and 16, a micro LED may be directly connected to a backplane substrate in which the micro LED drive circuit 3 is integrated, and the display device 10 may be constituted by a plurality of backplane substrates.

The pixel lens 17 is made of transparent resin and covers the red light emitting micro LED 14, the green light emitting micro LED 15, and the blue light emitting micro LED 16 so as to confine the micro LEDs 14, 15, and 16 therein. The pixel lens 17 is effective in mixing light output from the red light emitting micro LED 14, light output from the green light emitting micro LED 15, and light output from the blue light emitting micro LED 16. Thereby, the pixel lens 17 enables the light of three colors output from the respective micro LEDs 14, 15, and 16 to appear to be output from one point.

The top of the pixel lens 17 is formed into a convex lens shape. Thereby, the pixel lens 17 allows the light from the red light emitting micro LED 14, the green light emitting micro LED 15, and the blue light emitting micro LED 16 to be focused and made incident on the micro lens 55 and is able to reduce leakage of light to an adjacent pixel unit 11.

In this manner, the three-dimensional display 100 of the present embodiment is able to improve the luminance of the display portion 60 by efficiently utilizing light from micro LEDs 14, 15, and 16. For example, with such configuration, the display portion 60 is able to achieve the luminance higher than (1000/N) cd/m$^2$. Accordingly, the display portion 60 is able to brightly display a three-dimensional image and improve image quality of the three-dimensional image. Note that, N indicates the number of pixels 12 included in the pixel unit 11.

Note that, a light outputting point of the pixel 12 is not the micro LED 14, 15, or 16, but the top of the pixel lens 17. Thus, the micro lens array 50 is desirably installed at a position where a distance from the top of the pixel lens 17 to the position is equal to the focal distance f.

(Characteristics of Three-Dimensional Display 100)

The inventor actually evaluated luminance of the three-dimensional display 100 that has a configuration as follows.

Configuration of Micro Lens Array 50
An arrangement pitch of the micro lenses 55 is 500 µm in both an X direction and a Y direction.
The focal distance f of the micro lenses 55 is 500 µm.
The number of micro lenses 55 is 256×192.

Configuration of Pixel Unit 11
The number of pixels 12 is 49 in 7 rows×7 columns (N=49)
The center of the arrangement of the 49 pixels 12 is on the optical axis of the micro lens 55.
A pitch of the pixels 12 is 60 µm in both the X direction and the Y direction.
The 3D view angle is ±19.8° in both the X direction and the Y direction.
A space between an outmost peripheral pixel 12 and a portion right under the end of the micro lens 55 has 70 µm.

Configuration of Pixel 12
The red light emitting micro LED 14, the green light emitting micro LED 15, and the blue light emitting micro LED 16 are arranged at the center of the pixel 12.
Each of the micro LEDs has two electrodes of a P-side electrode and an N-side electrode arranged on one surface, is connected to the micro LED drive circuit 3 by the pixel wire 22 on the substrate 5 by flip-chip bonding connection, and emits light upon supply of the current at each predetermined voltage.

Configuration of Red Light Emitting Micro LED 14

Micro LED chip made of AlInGaP-based compound semiconductor

Size of 15 μm×15 μm

Height of 10 μm

Light output of 0.75 μW at voltage of 2.5 V and current of 1 μA

Light emission peak wavelength of 630±5 nm

Configuration of Green Light Emitting Micro LED 15

Micro LED chip made of InGaN-based compound semiconductor

Size of 15 μm×30 μm

Height of 8 μm

Light output of 0.75 μW at voltage of 3.1 V and current of 1 μA

Light emission peak wavelength of 525±4 nm

Configuration of Blue Light Emitting Micro LED 16

Micro LED chip made of InGaN-based compound semiconductor

Size of 15 μm×15 μm

Height of 8 μm

Light output of 0.9 μW at voltage of 3.0 V and current of 1 μA

Light emission peak wavelength of 460±5 nm

Configuration of Substrate 5

A metal plate made of aluminum alloy is used as a base, an insulating layer is provided thereon, and a copper wire of two layers is further provided thereon.

A column signal line, a power supply, and a GND are in a first layer of the wire.

A row selection line is in a second layer of the wire.

A column signal output circuit is mounted at a column side end and a row selection circuit is mounted at a row side end.

The red light emitting micro LED 14, the green light emitting micro LED 15, the blue light emitting micro LED 16, and the micro LED drive circuit 3 are mounted on another flexible substrate (interposer substrate) in which the pixel wire 22 is formed, and then, are bonded on the wire having the two layers.

The pixel wire 22 and the second layer of the wire are connected via a through hole provided in the flexible substrate.

Configuration of Pixel Lens 17

The pixel lens 17 is formed after the micro LEDs 14, 15, and 16 are mounted on the substrate 5.

Diameter of 53 μm

Height of 50 μm

An upper part has a hemispheric shape with a radius of 30 μm.

A part from the surface of the substrate 5 to a height of 20 μm has a columnar shape.

The substrate 5 is attached to a mold, and transparent silicone resin is injected to the mold to make the pixel lenses simultaneously.

Configuration of Display Portion 60

The pixel lens 17 is formed on the surface of the substrate 5, and then, the micro lens array 50 is installed on an upper side of the substrate 5.

The micro lens array 50 is supported by pillars at a plurality of locations on the surface of the substrate 5.

A height of each of the pillars is set higher, by 35 μm, than the focal distance f of 500 μm.

In the three-dimensional display 100 configured as described above, currents of 1.1 μA, 2.25 μA, and 1.1 μA were respectively supplied to the red light emitting micro LED 14, the green light emitting micro LED 15, and the blue light emitting micro LED 16 so as to light all of the micro LEDs 14, 15, and 16. At this time, the luminance of the display portion 60 observed at a distance 1 m away from a center part of the three-dimensional display 100 was 930 cd/m$^2$. Power consumption at this time was 35 W.

This indicates a state where an entire screen of the display portion 60 is lighted in white light, and power consumption in an ordinary display state is less than that in the state. A value of the power consumption of the three-dimensional display 100 under the aforementioned conditions is almost equal to that of power consumption of an ordinary liquid crystal display.

In a case where three-dimensional display by the integral imaging technology is performed by combining a usual liquid crystal display for two-dimensional display and a micro lens array, it is difficult to achieve such high luminance. For example, the luminance was 20 cd/m$^2$ ($\approx$1000 cd/m$^2$/N) when the integral imaging technology was applied by using a full-high vision liquid crystal monitor, which has a size of 7 inches and has relatively high luminance of 1000 cd/m$^2$, in combination with the micro lens array 50 described above. In this manner, the luminance of the display portion is (1000/N) cd/m$^2$ in the three-dimensional display by the integral imaging technology using two-dimensional display of the related art, whereas the display portion according to the present embodiment is able to achieve much higher luminance.

As described above, according to the evaluation by the inventor, the three-dimensional display 100 using the micro LEDs 14, 15, and 16 of the present embodiment has very high light emission efficiency and is able to appropriately achieve substantially the same luminance as that of the usual flat display.

Moreover, the inventor created a three-dimensional display without the pixel lens 17 in order to evaluate an effect of the pixel lens 17, and evaluated luminance. In the three-dimensional display without the pixel lens 17, luminance when the display portion 60 was viewed from a front surface was 870 cd/m$^2$. This indicated that the luminance was slightly lower than that of the three-dimensional display 100 with the pixel lens 17. In addition, in the three-dimensional display without the pixel lens 17, the luminance was greatly lowered at a position near an end of the 3D view angle. In the three-dimensional display 100 with the pixel lens 17, even at the position near the end of the 3D view angle, the luminance of about 70% of the luminance at the front surface of the display portion 60 was maintained. However, in the three-dimensional display without the pixel lens 17, at the position near the end of the 3D view angle, the luminance was lowered by 50% from the luminance at the front surface of the display portion 60. In this way, it was confirmed that luminance distribution within the 3D view angle was able to be considerably improved by the pixel lens 17.

Embodiment 2

Embodiment 2 of the disclosure will be described below. Note that, for convenience of description, members having the same functions as those of the members described in Embodiment 1 above will be given the same reference signs and description thereof will not be repeated.

Figure 6:
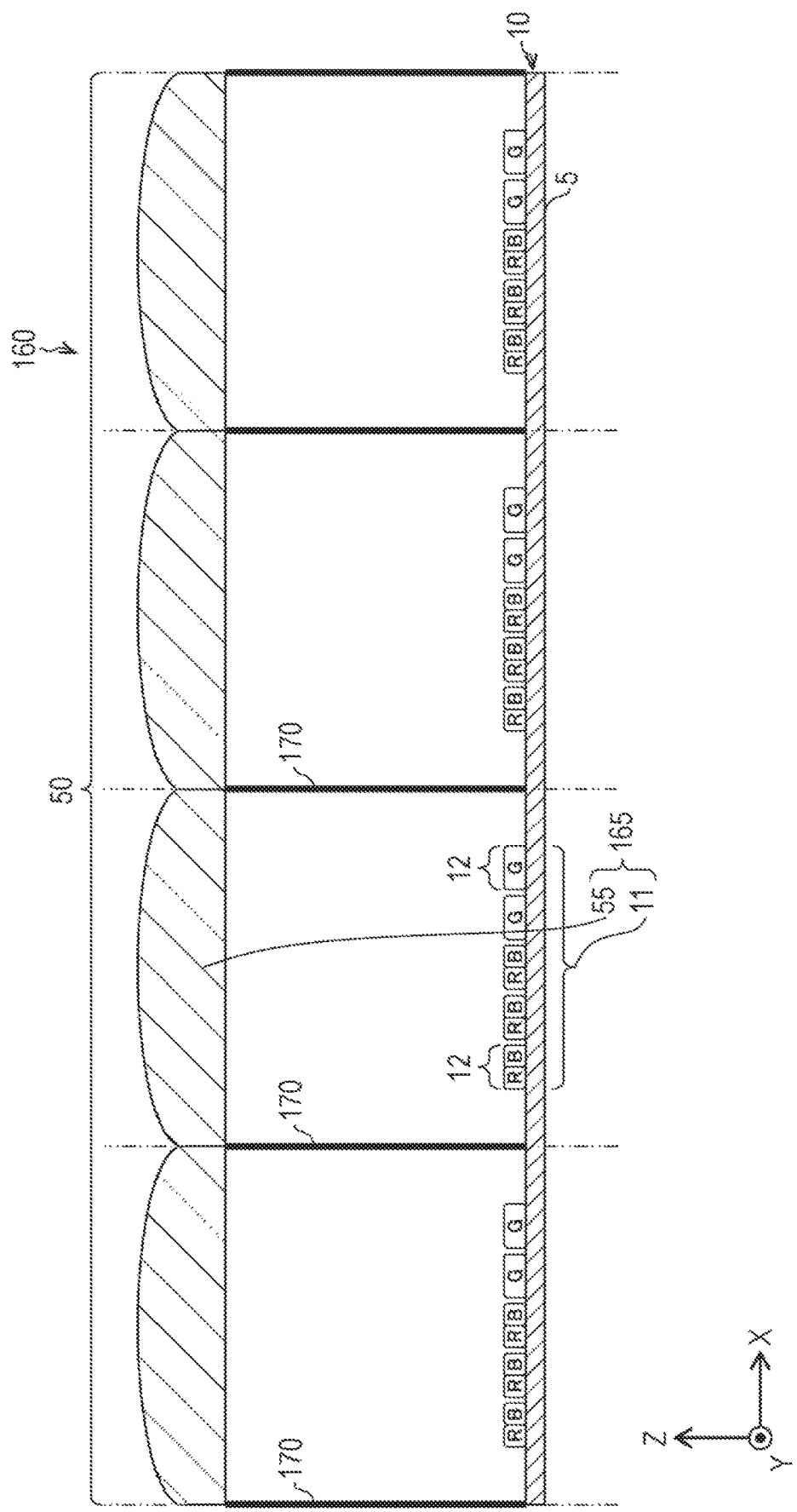
FIG. 6 is a view schematically illustrating a configuration of a display portion according to Embodiment 2.

FIG. 6 is a view schematically illustrating a configuration of a display portion 160 according to Embodiment 2. As illustrated in FIG. 6, the display portion 160 includes a plurality of display units 165 each of which includes one micro lens 55 and one pixel unit 11. The display portion 160 also includes a partition 170 that is provided between display units 165 adjacent to each other and that extends over the focal distance f of the micro lens 55.

The partition 170 is formed of a material including a light-absorbing material. Adjacent display units 165 are separated from each other by the partition 170. In this manner, the partition 170 blocks light emitted from the pixel unit 11 of one display unit 165 to leak into a different display unit 165 that is adjacent thereto and be incident on the micro lens 55 of the different display unit 165.

Though not illustrated, the partition 170 has a square shape and surrounds an outer periphery of the micro lens 55 in top view. It is most desirable that the partition 170 is configured to partition a space from a lower surface of the micro lens 55 to the substrate 5 of a corresponding pixel unit 11. Thereby, the partition 170 also contributes to keeping a distance between the display device 10 and the micro lens array 50 uniform.

In this manner, in the display portion 160 of Embodiment 2, since adjacent display units 165 are separated from each other by the partition 170, light does not leak between adjacent pixel units 11, thus making it possible to achieve improvement of image quality of a three-dimensional image.

Embodiment 3

Embodiment 3 of the disclosure will be described below. Note that, for convenience of description, members having the same functions as those of the members described in Embodiments 1 and 2 described above will be given the same reference signs and description thereof will not be repeated.

In Embodiment 3, an aerial three-dimensional display 300 that includes the three-dimensional display 100 described in Embodiment 1 or 2 and displays a three-dimensional image generated by the three-dimensional display 100 in the air will be described.

Figure 7:
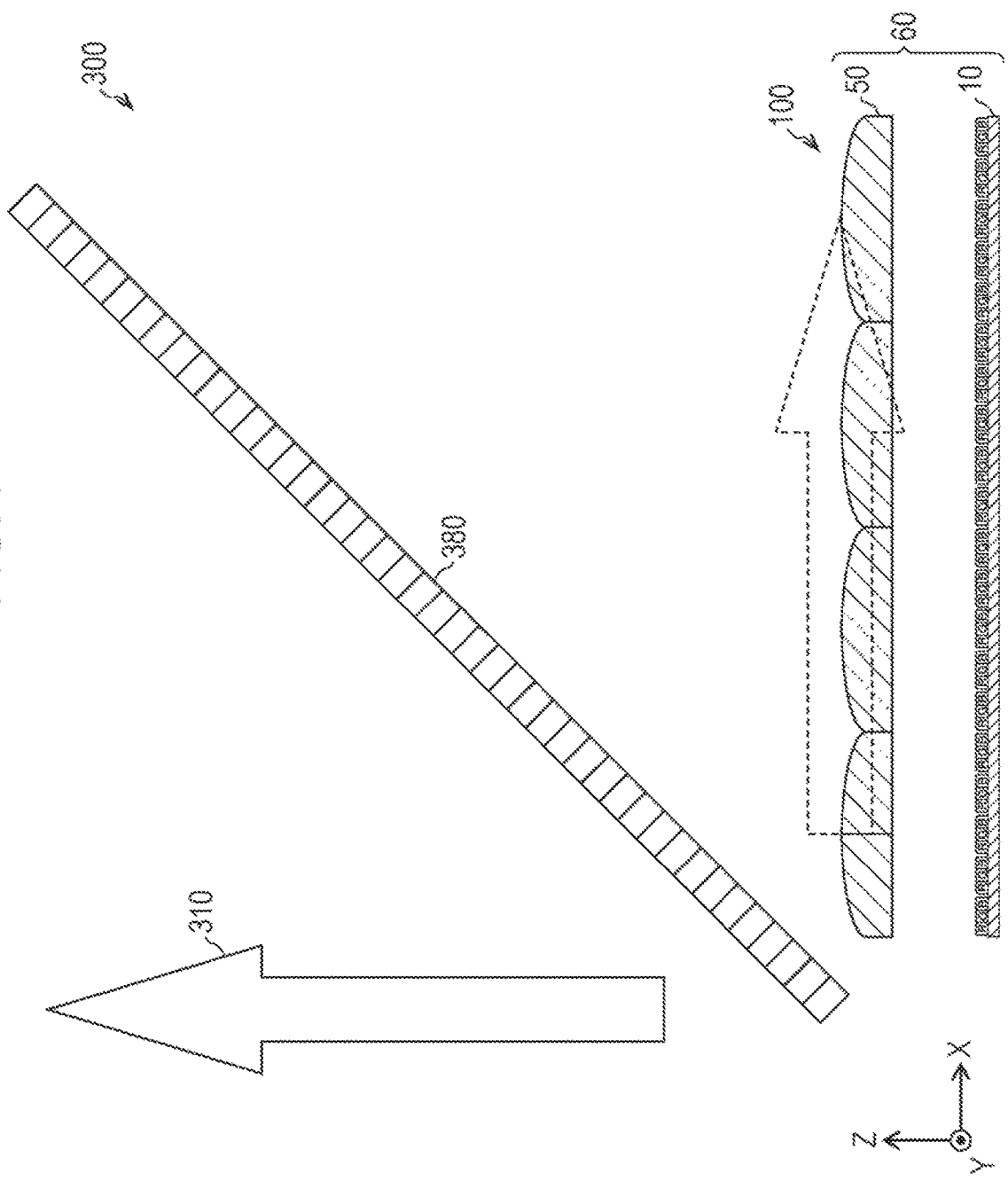
FIG. 7 is a view schematically illustrating a configuration of an aerial three-dimensional display according to Embodiment 3.

FIG. 7 is a view schematically illustrating a configuration of the aerial three-dimensional display 300 according to Embodiment 3. As illustrated in FIG. 7, the aerial three-dimensional display 300 includes the three-dimensional display 100 and a reflection optical device 380. The reflection optical device 380 is an optical member by which the three-dimensional image generated by the three-dimensional display 100 is displayed in the air, and a dihedral corner reflector array (DCRA) is used as the reflection optical device 380 in the present embodiment.

The aerial three-dimensional display 300 includes the display portion 60 that is arranged in parallel to, for example, a horizontal plane (X-Y plane) and the reflection optical device 380 that is arranged so as to be inclined at about 45 degrees with respect to the display portion 60. The three-dimensional display 100 and the reflection optical device 380 extend as a plane in the Y direction, and the three-dimensional image formed by the three-dimensional display 100 is displayed in the air as a three-dimensional floating image 310 by the reflection optical device 380. The three-dimensional floating image 310 is displayed so as to spread over a Y-Z plane.

With the aerial three-dimensional display 300, a user is able to view, by visual observation from a horizontal direction, the three-dimensional floating image 310 formed in the air by the reflection optical device 380. Additionally, the aerial three-dimensional display 300 is configured such that the user is able to visually identify the three-dimensional floating image 310 whenever it is viewed from a direction within the 3D view angle.

(Characteristics of Aerial Three-Dimensional Display 300)

The inventor similarly evaluated the aerial three-dimensional display 300 with a configuration similar to the configuration of the three-dimensional display 100 described in Embodiment 1. According to the evaluation, luminance of the aerial three-dimensional display 300 was 530 cd/m$^2$. This indicated that the luminance was lower by about 43% than that of the three-dimensional display 100. However, the luminance as high as that of the usual two-dimensional display for indoor use was appropriately achieved. Note that, reduction in the luminance of the aerial three-dimensional display 300 is mainly caused by reflection loss by the reflection optical device 380. The reduction in the luminance is able to be improved by increasing an opening ratio of the reflection optical device 380.

Embodiment 4

Embodiment 4 of the disclosure will be described below. Note that, for convenience of description, members having the same functions as those of the members described through Embodiments 1 to 3 described above will be given the same reference signs and description thereof will not be repeated.

In Embodiment 4, an aerial three-dimensional display 400 that includes the three-dimensional display 100 described in Embodiment 1 or 2 and displays a three-dimensional image generated by the three-dimensional display 100 in the air will be described.

Figure 8:
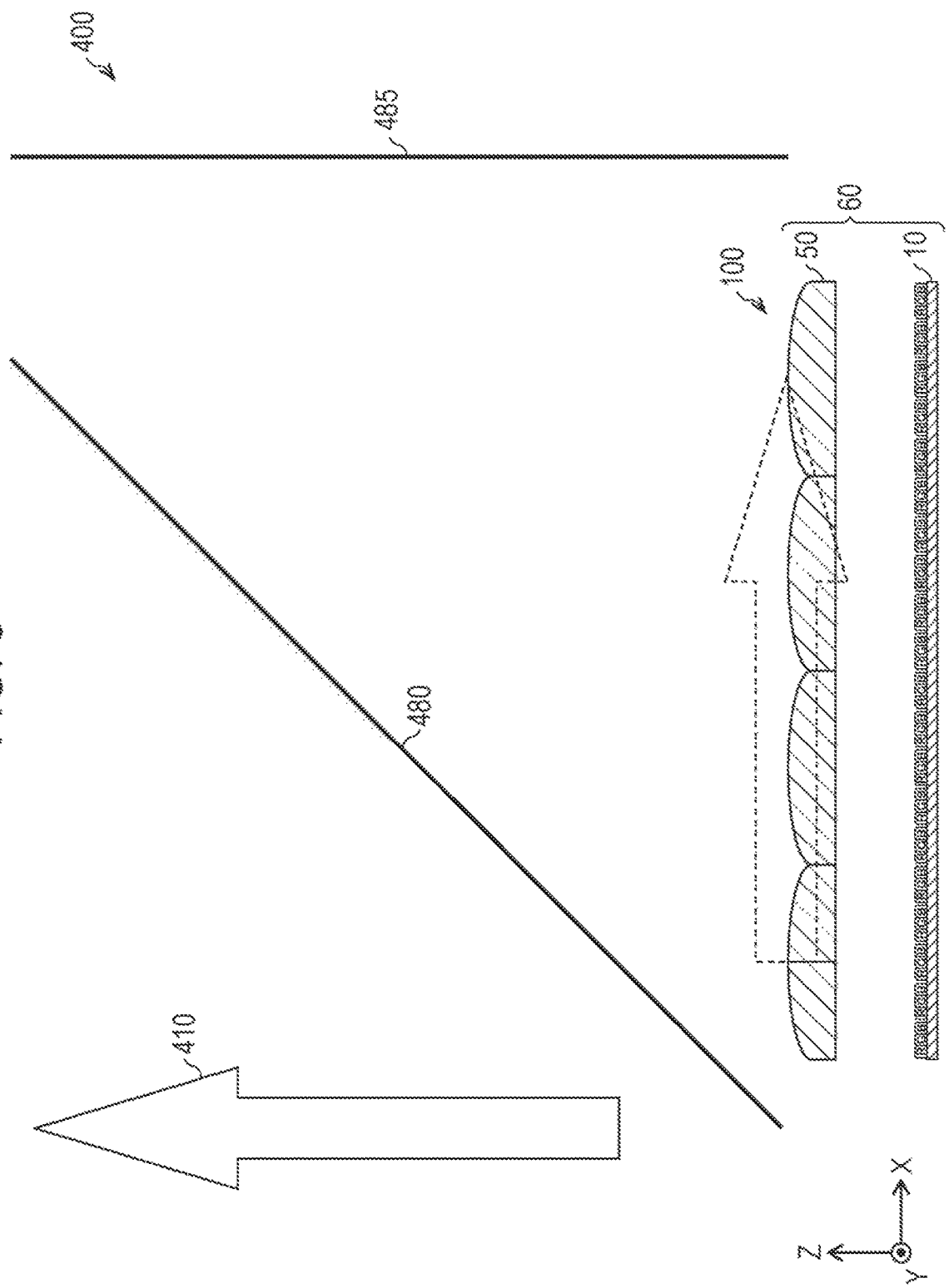
FIG. 8 is a view schematically illustrating a configuration of an aerial three-dimensional display according to Embodiment 4.

FIG. 8 is a view schematically illustrating a configuration of the aerial three-dimensional display 400 according to Embodiment 4. As illustrated in FIG. 8, the aerial three-dimensional display 400 includes the three-dimensional display 100, a half mirror 480, and a retroreflection film 485. The half mirror 480 and the retroreflection film 485 are optical members by which the three-dimensional image generated by the three-dimensional display 100 is displayed in the air. That is, in the aerial three-dimensional display 400 according to Embodiment 4, the reflection optical device 380 in the aerial three-dimensional display 300 described in Embodiment 3 is replaced with the half mirror 480 and the retroreflection film 485.

The aerial three-dimensional display 400 includes the display portion 60 that is arranged in parallel to, for example, the horizontal plane (X-Y plane) and the half mirror 480 that is arranged so as to be inclined at about 45 degrees with respect to the display portion 60. The aerial three-dimensional display 400 also includes the retroreflection film 485 that is arranged in parallel to the Y-Z plane orthogonal to the horizontal plane. The three-dimensional display 100, the half mirror 480, and the retroreflection film 485 extend as a plane in the Y direction.

Light that forms the three-dimensional image generated by the three-dimensional display 100 is reflected by the half mirror 480 with a reflection angle equal to an incident angle and is incident on the retroreflection film 485. The incident light is reflected by the retroreflection film 485 in the incident direction. Thereby, the three-dimensional image generated by the three-dimensional display 100 is formed on a rear side of the half mirror 480 when viewed from the retroreflection film 485.

The user is able to visually identify a three-dimensional floating image 410, which is formed by the aerial three-dimensional display 400, from the horizontal direction. The three-dimensional floating image 410 is displayed so as to spread over the Y-Z plane, so that the user is able to visually identify the three-dimensional floating image 410, which is formed by the aerial three-dimensional display 400, as a three-dimensional image whenever it is viewed from a direction within the 3D view angle.

Note that, the aerial three-dimensional display 400 has a configuration in which the half mirror 480 and the retroreflection film 485 whose areas are easily increased are used to form the three-dimensional floating image 410, so that it is possible to easily increase an display area.

Embodiment 5

Embodiment 5 of the disclosure will be described below. Note that, for convenience of description, members having the same functions as those of the members described in Embodiment 1 described above will be given the same reference signs and description thereof will not be repeated.

In Embodiment 5, description will be given for an example in which a display device 510 having a configuration different from that of the display device 10 of the display portion 60 which is described in Embodiment 1 is used.

Figure 9:
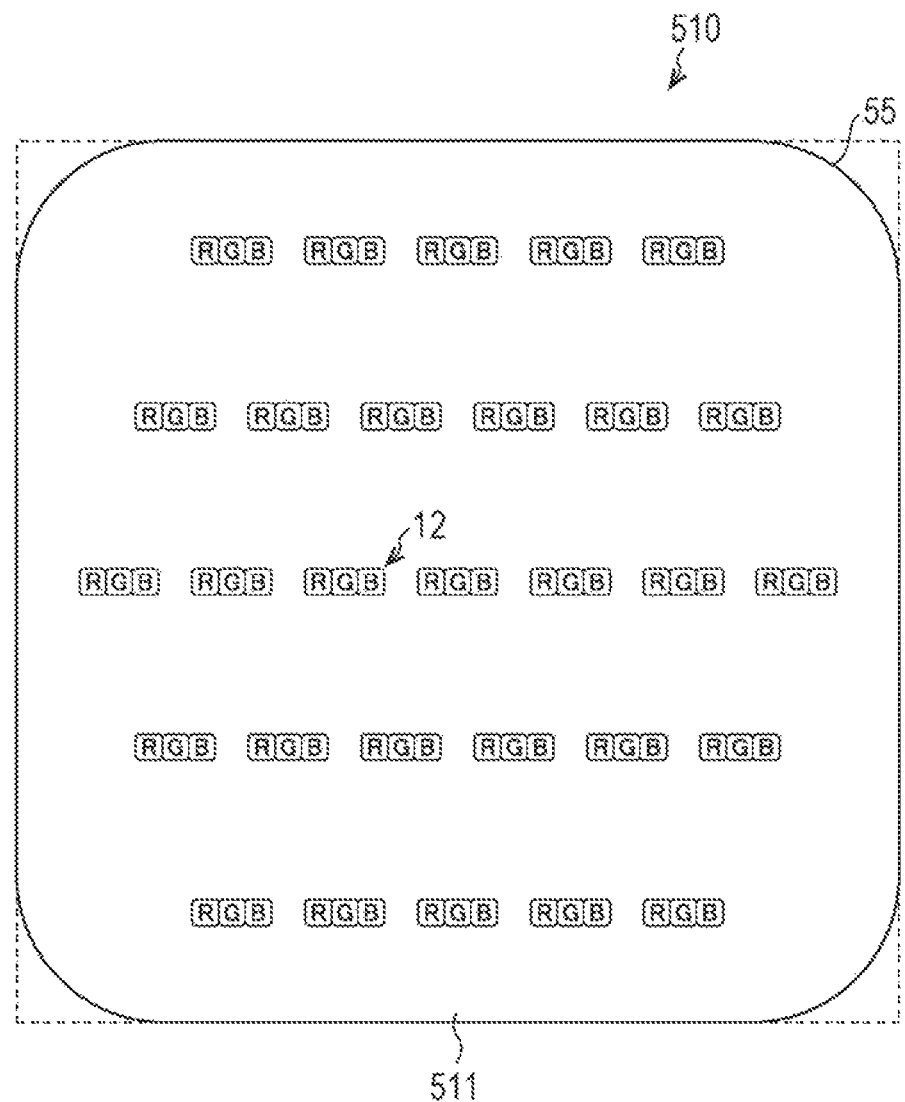
FIG. 9 is a view schematically illustrating a configuration of a display device according to Embodiment 5.

FIG. 9 is a view schematically illustrating a configuration of the display device 510 according to Embodiment 5. As illustrated in FIG. 9, the display device 510 is different from the display device 10 described in Embodiment 1 in an arrangement pattern of the pixels 12 within each of the micro lenses 55. In a pixel unit 511 of the display device 510, the number of pixels 12 arranged in an X axis direction at the center thereof is greater than the number of pixels arranged in the X axis direction at a place away from the center in a Y axis direction. The pixel unit 511 may be configured such that the number of pixels 12 arranged in the X axis direction is gradually reduced as being away from the center in the Y axis direction.

In the three-dimensional display 100, four corners of the 3D view angle are less likely to be actually used. Thus, even in a case where pixels corresponding to the four corners of the 3D view angle are reduced, influence on the displayed image is small, and when the reduced pixels are arranged at the center part, it is possible to expand the 3D view angle near the center in the Y axis direction. In this manner, in the three-dimensional display 100, the arrangement of the pixels 12 is able to be adjusted depending on how the 3D view angle is configured.

It is difficult to arrange the pixels in a nonuniform pattern in a liquid crystal display or an organic EL display. On the other hand, in the three-dimensional display 100, the micro LEDs 14, 15, and 16 are used for each of the pixels 12, so that a degree of freedom in arrangement is very high and a desired number of pixels 12 are able to be installed in each of the pixel units 11. Moreover, wiring of the row selection line 23 or the column signal line 25 to each of the pixels 12 is easily adjusted. Accordingly, the display device 510 that uses the micro LEDs 14, 15, and 16 is able to enhance a degree of freedom in setting the 3D view angle by utilizing flexibility in the arrangement of the pixels 12.

Embodiment 6

Embodiment 6 of the disclosure will be described below. Note that, for convenience of description, members having the same functions as those of the members described in Embodiment 1 described above will be given the same reference signs and description thereof will not be repeated.

Figure 10:
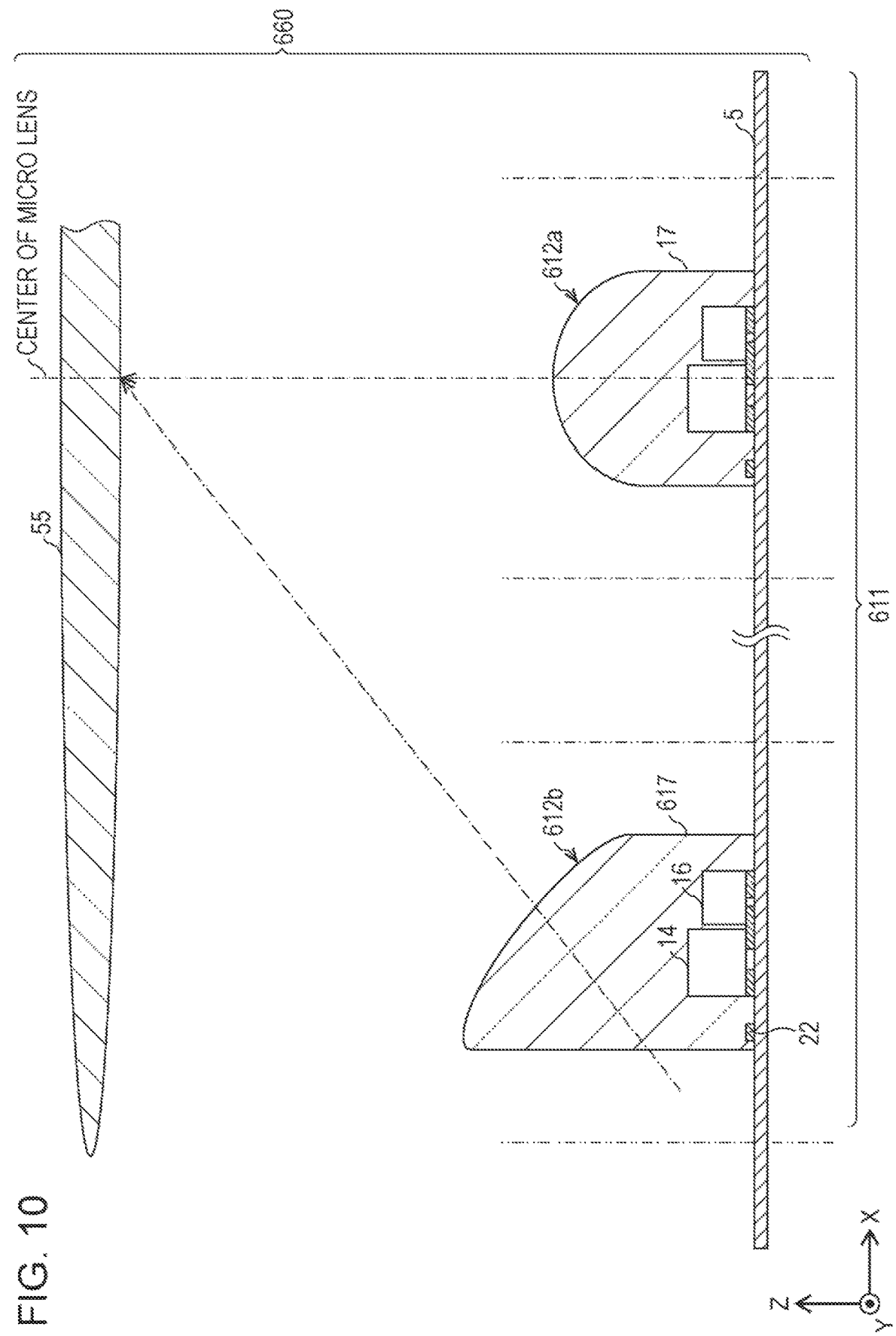
FIG. 10 is a view schematically illustrating a configuration of a display portion according to Embodiment 6.

In Embodiment 6, description will be given for an example in which pixels 612*a* and 612*b* each having a configuration different from that of the pixel 12 described in Embodiment 1 are used. FIG. 10 is a view schematically illustrating a configuration of a display portion 660 according to Embodiment 6. As illustrated in FIG. 10, in the display portion 660, a shape of a pixel lens is different between a center pixel 612*a* arranged near the center of the micro lens 55 and an end pixel 612*b* arranged at an outer periphery.

The center pixel 612*a* has a similar configuration to that of the pixel 12 described in Embodiment 1 and includes the pixel lens 17 that has a shape symmetric with respect to the optical axis. The pixel lens 17 having the shape symmetric with respect to the optical axis causes light from the micro LEDs 14, 15, and 16 to be focused and made incident on the micro lens 55, but part of the light from the micro LEDs 14, 15, and 16 becomes leaked light directed toward an adjacent micro lens 55.

According to the display portion 660 of the present embodiment, in a pixel unit 611, an optical axis of an end pixel lens 617 of at least the end pixel 612*b* which is positioned at an outmost periphery among a plurality of pixels is directed to the center of a corresponding micro lens 55. The end pixel lens 617 is configured such that, for example, an optical axis at a top of the lens having a convex shape is directed to the center of the micro lens 55.

Furthermore, in the display portion 660, it is desirable that a shape of the top of the pixel lens 17 in addition to the pixel positioned at the outmost periphery is appropriately adjusted in accordance with arrangement positions of the pixels 12 within the pixel unit 611 so that the optical axis of the lens is directed to the center of the micro lens 55. This makes it possible to cause light from the center pixel 612*a* and the end pixel 612*b* in the pixel unit 611 to be directed to the center of the micro lens 55 and to reduce the leaked light that is directed to an adjacent micro lens 55. As a result, it is possible to suppress reduction in contrast of a three-dimensional image formed by the three-dimensional display 100 and reduction in luminance at an end of the 3D view angle.

Embodiment 7

Embodiment 7 of the disclosure will be described below. Note that, for convenience of description, members having the same functions as those of the members described in Embodiment 1 described above will be given the same reference signs and description thereof will not be repeated.

Figure 11:
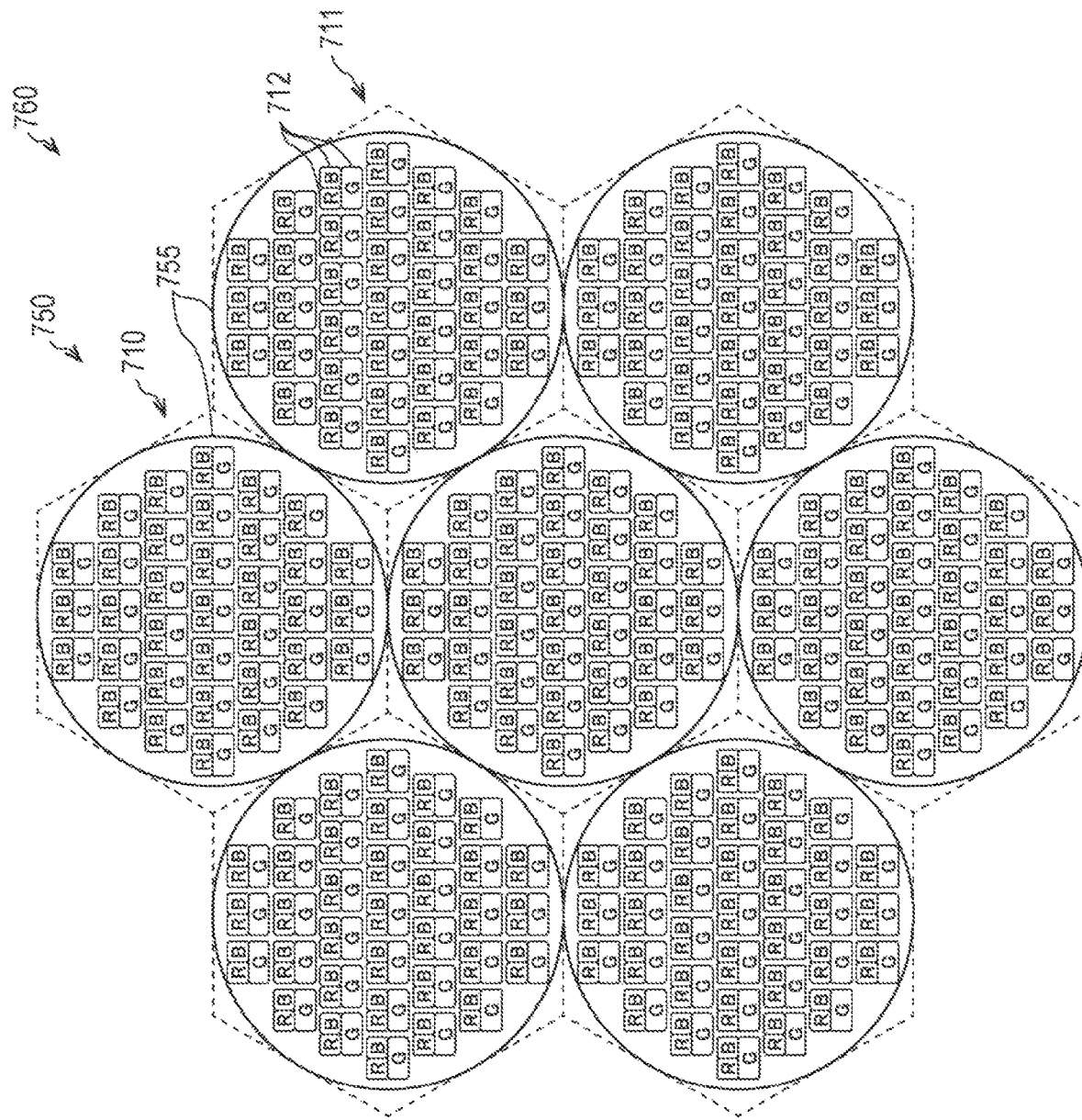
FIG. 11 is a view schematically illustrating a configuration of a display portion according to Embodiment 7.

In Embodiment 7, description will be given for an example in which a display portion 760 having a configuration different from that of the display portion 60 described in Embodiment 1 is used. FIG. 11 is a view schematically illustrating a configuration of the display portion 760 according to Embodiment 7. As illustrated in FIG. 11, the display portion 760 is configured such that micro lenses 755 are not arranged in a simple two dimensional matrix but are arranged so as to be deviated by half a pitch every other column. Accordingly, the micro lenses 755 of a micro lens array 750 and pixel units 711 of a display device 710 are arranged in the same way.

Each of the pixel units 711 may have a hexagonal shape in which the plurality of pixels 712 are arranged to fill its hexagonal region as illustrated in FIG. 11, for example. In this case, the micro lenses 755 may have a round shape. In this manner, in the display portion 760 that includes the micro lens array 750 formed by arranging the micro lenses 755 so as to be formed into the round shape, the 3D view angle has a nearly round shape. The pixel units 711 have space without pixels between the pixel units as shown in Embodiment 1. Despite a pixel unit shape, it is preferable to have space where no pixels are placed between the pixel units to reduce the stray light entering one of the micro lenses from not-paired pixel units.

In this configuration, in comparison with a case where the micro lenses 55 and the pixel units 11 are arranged in a simple two-dimensional matrix, the micro lenses 755 and the pixel units 711 can be densely packed into the micro lens array 750 and the display device 710. As a result, it is possible to improve resolution of a three-dimensional image displayed by the display portion 760 and to achieve smooth three-dimensional display. Improvement of resolution is also a superior point of the three-dimensional display adopted micro LED, because it is difficult for conventional LCD display to realize the pixel arrangement illustrated in FIG. 11, as described in Embodiment 5.

CONCLUSION

A three-dimensional display (100) according to an aspect 1 of the disclosure includes a display portion (60) that includes a micro lens array (50) in which a plurality of micro lenses (55) are arranged in a two-dimensional array and a display device (10) in which a plurality of pixel units (11) that are paired with the respective micro lenses (55) are arranged in a two-dimensional array, in which each of the pixel units (11) has a plurality of pixels (12) and each of the pixels (12) includes a micro LED (14, 15, 16).

According to the aforementioned configuration, each of the pixels (12) is configured to have high light emission efficiency and includes the micro LED (14, 15, 16) that is able to be stably used for a long time with a high current, so that it is possible to display a three-dimensional image efficiently and brightly.

The three-dimensional display (100) according to an aspect 2 of the disclosure may be configured such that the pixels (12) output light in different directions through a corresponding micro lens (55), in the aspect 1.

According to the aforementioned configuration, the pixels (12) are able to correctly display optical signals of an object as viewed from corresponding directions.

The three-dimensional display (100) according to an aspect 3 of the disclosure may be configured such that when the number of pixels (12) included in the pixel unit (11) is N, luminance of the display portion (60) is higher than $(1000/N)$ cd/m$^2$, in the aspect 1 or 2.

According to the aforementioned configuration, it is possible to display a three-dimensional image brightly.

The three-dimensional display (100) according to an aspect 4 of the disclosure may be configured such that the micro LED (14, 15, 16) is arranged at a center part of the pixel (12), in the aspects 1 to 3.

According to the aforementioned configuration, a color of a three-dimensional image is not changed, depending on an angle at which a user views the display portion (60), from a set value.

The three-dimensional display (100) according to an aspect 5 of the disclosure may be configured such that the micro LED (14, 15, 16) is covered with a pixel lens (17) made of transparent resin, in the aspects 1 to 4.

According to the aforementioned configuration, it is possible to cause light from the micro LED (14, 15, 16) to be directed to a center of the micro lens (55) and improve luminance distribution within the 3D view angle.

The three-dimensional display (100) according to an aspect 6 of the disclosure may be configured such that in the pixel unit (611), an optical axis of the pixel lens of at least the pixel (12) which is positioned at an outmost periphery among the plurality of pixels (12) is directed to a center of a corresponding micro lens (55), in the aspect 5.

According to the aforementioned configuration, it is possible to cause light from the micro LED to be directed to the center of the micro lens (55) and improve luminance distribution within the 3D view angle.

The three-dimensional display (100) according to an aspect 7 of the disclosure may be configured such that the display portion (60) includes a plurality of display units (165) each of which includes one of the micro lenses (55) and one of the pixel units (11), and the display units (165) adjacent to each other are separated from each other by a partition (170) formed of a material including a light-absorbing material, in the aspects 1 to 6.

According to the aforementioned configuration, it is possible to prevent or reduce leakage of light and achieve improvement of image quality of a three-dimensional image.

The three-dimensional display (100) according to an aspect 8 of the disclosure may be configured such that the pixel (12) includes at least three micro LEDs (14, 15, 16) of a micro LED (14) that emits red light, a micro LED (15) that emits green light, and a micro LED (16) that emits blue light, in the aspects 1 to 7.

According to the aforementioned configuration, it is possible to display a three-dimensional image brightly with various colors.

The three-dimensional display (100) according to an aspect 9 of the disclosure may be configured such that the micro LED (14) that emits red light among the three micro LEDs (14, 15, 16) is an AlInGaP-based compound semiconductor, in the aspect 8.

According to the aforementioned configuration, it is possible to expand a color gamut of a color image, suppress power consumption, and display a three-dimensional image brightly.

The three-dimensional display (100) according to an aspect 10 of the disclosure may be configured such that the micro LED (15) that emits green light among the three micro LEDs (14, 15, 16) is an InGaN-based compound semiconductor, in the aspect 8.

According to the aforementioned configuration, it is possible to expand a color gamut of a color image, suppress power consumption, and display a three-dimensional image brightly.

The three-dimensional display (100) according to an aspect 11 of the disclosure may be configured such that the micro LED (16) that emits blue light among the three micro LEDs (14, 15, 16) is an InGaN-based compound semiconductor, in the aspect 8.

According to the aforementioned configuration, it is possible to expand a color gamut of a color image, suppress power consumption, and display a three-dimensional image brightly.

An aerial three-dimensional display (300) according to an aspect 12 of the disclosure may be configured to include the three-dimensional display (100) of any one of the aspect 1 to 11 and a reflection optical device (380) by which a three-dimensional image generated by the three-dimensional display (100) is displayed in the air.

According to the aforementioned configuration, it is possible to display a three-dimensional floating image brightly.

The disclosure is not limited to each of Embodiment described above and may be modified in various manners within the scope of the claims, and an embodiment achieved by appropriately combining techniques disclosed in different Embodiments is also encompassed in the technical scope of the disclosure. Further, by combining the techniques disclosed in each of Embodiment, a new technical feature may be formed.

The present disclosure contains subject matter related to that disclosed in Japanese Priority Patent Application JP 2018-018224 filed in the Japan Patent Office on Feb. 5, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A direct viewing three-dimensional display comprising:
a display portion that includes a micro lens array in which a plurality of micro lenses are arranged in a two-dimensional array and a display device in which a plurality of pixel units that are paired with the respective micro lenses are arranged in a two-dimensional array, wherein
each of the plurality of pixel units has a plurality of pixels,
each of the plurality of pixels includes only one pixel lens and at least three micro LEDs of a micro LED that emits red light, a micro LED that emits green light, and a micro LED that emits blue light,
the at least three micro LEDs are covered with the pixel lens so as to confine the at least three micro LEDs in the pixel lens, and
the pixel lens focuses the red light, the green light, and blue light on the paired micro lens.

2. The direct viewing three-dimensional display according to claim 1, wherein the plurality of pixels in the pixel unit output light in different directions through the paired micro lens.

3. The direct viewing three-dimensional display according to claim 1, wherein when a number of pixels included in the pixel unit is N, luminance of the display portion is higher than $(1000/N) cd/m^2$.

4. The direct viewing three-dimensional display according to claim 1, wherein the at least three micro LEDs are arranged at a center part of the pixel.

5. The direct viewing three-dimensional display according to claim 1, wherein the pixel lens is made of transparent resin.

6. The direct viewing three-dimensional display according to claim 5, wherein, in the pixel unit, a pixel lens shape of the pixel at the outmost periphery is different from the pixel lens shape of the pixel at a center of the pixel unit, so as to direct an optical axis of the pixel lens of the pixel at the outmost periphery to a center of the paired micro lens.

7. The direct viewing three-dimensional display according to claim 1, wherein
the display portion includes a plurality of display units each of which includes one of the micro lenses and one of the plurality of pixel units, and
the display units adjacent to each other are separated from each other by a partition formed of a material including a light-absorbing material.

8. The direct viewing three-dimensional display according to claim 1, wherein the micro LED that emits green light among the at least three micro LEDs is an InGaN-based compound semiconductor.

9. The direct viewing three-dimensional display according to claim 1, wherein the micro LED that emits blue light among the at least three micro LEDs is an InGaN-based compound semiconductor.

10. An aerial three-dimensional display comprising:
the direct viewing three-dimensional display according to claim 1, and a reflection optical device by which a three-dimensional image generated by the three-dimensional display is displayed in the air.

11. The aerial three-dimensional display according to claim 10, wherein the reflection optical device is a dihedral corner reflector array.

12. The aerial three-dimensional display according to claim 10, wherein the reflection optical device includes a retroreflector.

13. The direct viewing three-dimensional display according to claim 1, wherein the plurality of pixel units have a micro LED drive circuit which supplies currents for lighting the at least three micro LEDs.

14. The direct viewing three-dimensional display according to claim 13, wherein each of the plurality pixels has the micro LED drive circuit.

15. The direct viewing three-dimensional display according to claim 1, wherein the display device includes a substrate whose surface has a light-absorbing material, made of a resin material that is mixed with black pigment or carbon black.

16. The direct viewing three-dimensional display according to claim 1, wherein the number of pixels arranged in an X axis direction at the center of the pixel unit is greater than the number of pixels arranged in the X axis direction at a place away from the center in a Y axis direction.

17. The direct viewing three-dimensional display according to claim 1, wherein the plurality of pixel units and the micro lenses are densely packed into the display device and the micro lens array, respectively, compared with simple two-dimensional matrix arrangement.

18. The direct viewing three-dimensional display according to claim 1, wherein the pixel unit has space without the plurality of pixels between neighboring pixel units.

19. A three-dimensional display comprising:
a display portion that includes a micro lens array in which a plurality of micro lenses are arranged in a two-dimensional array and a display device in which a plurality of pixel units that are paired with the respective micro lenses are arranged in a two-dimensional array, wherein
each of the plurality of pixel units has a plurality of pixels,
each of the plurality of pixels includes only one pixel lens and at least three micro LEDs of a micro LED that emits red light, a micro LED that emits green light, and a micro LED that emits blue light,
a distance between the micro lens array and the display device is equal to a focal distance of the micro lens,
the at least three micro LEDs are covered with the pixel lens so as to confine the at least three micro LEDs in the pixel lens, and
the pixel lens includes a convex lens shape portion and mixes the red light, the green light, and the blue light emitted from the at least three micro LEDs so that mixed light is emerged from one point on the pixel lens to the paired respective micro lens.

20. The three-dimensional display according to claim 19, wherein the multiple mixed light of the red light, the green light, and the blue light emitted from the at least three micro LEDs becomes white light.

21. The three-dimensional display according to claim 19, wherein the pixel lens is made of transparent resin.

22. The three-dimensional display according to claim 21, wherein a pixel lens shape of the pixel which is positioned at an outmost periphery among the plurality of pixels in the pixel unit is different from a pixel lens shape of the pixel which is positioned at a center of the pixel unit.

23. The three-dimensional display according to claim 19, wherein the display device includes a substrate whose surface has a light-absorbing material, made of a resin material that is mixed with black pigment or carbon black.

24. The three-dimensional display according to claim 19, wherein the pixel unit has space without the plurality of pixels between neighboring pixel units.

\* \* \* \* \*